United States Patent
Jenne et al.

(10) Patent No.: US 8,045,373 B2
(45) Date of Patent: Oct. 25, 2011

(54) METHOD AND APPARATUS FOR PROGRAMMING MEMORY CELL ARRAY

(75) Inventors: Fredrick B. Jenne, Sunnyvale, CA (US); Cynthia Ratnakumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 122 days.

(21) Appl. No.: 12/240,184

(22) Filed: Sep. 29, 2008

(65) Prior Publication Data

US 2009/0086538 A1   Apr. 2, 2009

Related U.S. Application Data

(60) Provisional application No. 60/997,413, filed on Oct. 2, 2007.

(51) Int. Cl.
*G11C 11/34* (2006.01)
(52) U.S. Cl. .................... 365/185.02; 365/185.24
(58) Field of Classification Search ............ 365/185.02, 365/185.24
See application file for complete search history.

(56) References Cited

U.S. PATENT DOCUMENTS

| | | | |
|---|---|---|---|
| 5,317,535 A | 5/1994 | Talreja et al. | |
| 5,912,837 A | 6/1999 | Lakhani | |
| 5,999,444 A | 12/1999 | Fujiwara et al. | |
| 6,392,928 B1 | 5/2002 | Roohparvar | |
| 6,660,585 B1 | 12/2003 | Lee et al. | |
| 6,671,207 B1 | 12/2003 | Parker | |
| 6,744,675 B1 | 6/2004 | Zheng et al. | |
| 6,975,535 B2 | 12/2005 | Kim et al. | |
| 6,980,472 B2 | 12/2005 | Ditewig et al. | |
| 7,064,978 B2 * | 6/2006 | Lee et al. | 365/185.01 |
| 7,085,161 B2 | 8/2006 | Chen et al. | |
| 7,177,977 B2 | 2/2007 | Chen et al. | |
| 7,187,030 B2 | 3/2007 | Chae et al. | |
| 7,202,521 B2 | 4/2007 | Kim et al. | |
| 7,262,994 B2 | 8/2007 | Fong et al. | |
| 7,269,072 B2 | 9/2007 | Prall et al. | |
| 7,349,261 B2 | 3/2008 | Mokhlesi | |
| 7,369,438 B2 * | 5/2008 | Lee | 365/185.17 |
| 7,433,231 B2 * | 10/2008 | Aritome | 365/185.17 |
| 7,692,961 B2 | 4/2010 | Eitan | |
| 2001/0048612 A1 * | 12/2001 | Yi et al. | 365/185.17 |
| 2002/0089877 A1 * | 7/2002 | Yi et al. | 365/185.24 |
| 2006/0049451 A1 * | 3/2006 | Georgescu | 257/315 |
| 2009/0080246 A1 * | 3/2009 | Jenne | 365/185.02 |
| 2009/0323412 A1 * | 12/2009 | Mokhlesi et al. | 365/185.02 |
| 2010/0006922 A1 * | 1/2010 | Matsuoka et al. | 257/324 |
| 2010/0182831 A1 * | 7/2010 | Cernea et al. | 365/185.02 |

OTHER PUBLICATIONS

International Search Report of International Searching Authority, dated Dec. 5, 2008 for International Application No. PCT/US08/11315; 2 pages.

International Written Opinion of International Searching Authority, dated Dec. 5, 2008 for International Application No. PCT/US08/11315; 5 pages.

Fujiwara, Ichiro, et al. "0.13 um Metal-Oxide-Nitride-Oxide-Semiconductor Single Transistor Memory Cell with Separated Source Line," Japanese Journal of Applied Physics, vol. 39, Part 1, No. 2A, Feb. 2000, pp. 417-423.

USPTO Notice of Allowance for U.S. Appl. No. 11/904,112 dated Dec. 1, 2009; 8 pages.

USPTO Notice of Allowance for U.S. Appl. No. 11/904,112 dated Aug. 6, 2009; 7 pages.

(Continued)

*Primary Examiner* — Michael Tran

(57) ABSTRACT

Disclosed are a method and device for programming an array of memory cells.

20 Claims, 18 Drawing Sheets

OTHER PUBLICATIONS

USPTO Notice of Allowance for U.S. Appl. No. 11/904,112 dated Feb. 25, 2009; 7 pages.

USPTO Notice of Allowance for U.S. Appl. No. 11/966,631 dated Jul. 30, 2010; 4 pages.

USPTO Final Rejection for U.S. Appl. No. 11/966,631 dated Sep. 29, 2009; 7 pages.

USPTO Non-Final Rejection for U.S. Appl. No. 11/966,631 dated Apr. 17, 2009; 8 pages.

USPTO Ex Parte Quayle Action for U.S. Appl. No. 11/966,631 dated Dec. 15, 2009; 4 pages.

International Search Report and Written Opinion of the International Searching Authority for International Application No. PCT/US07/20955 mailed May 5, 2008; 10 pages.

Wikipedia, the free encyclopedia, "Mosfet," Accessed Aug. 3, 2007; 13 pages.

\* cited by examiner

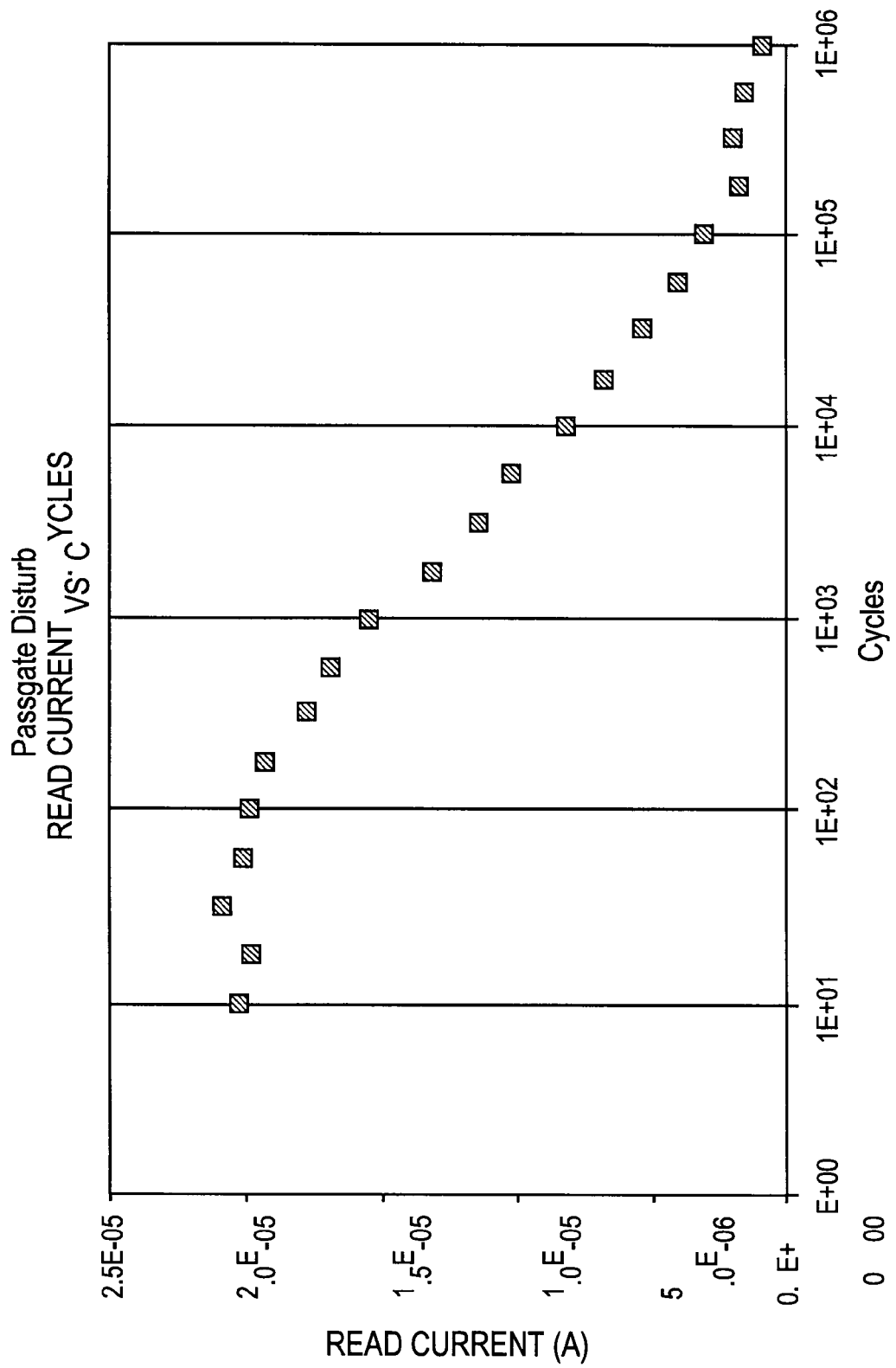

8,045,373 B2

METHOD AND APPARATUS FOR PROGRAMMING MEMORY CELL ARRAY

This application claims the benefit of the filing date of U.S. Provisional Patent Application No. 60/997,413, filed on Oct. 2, 2007, the entire contents of which are hereby incorporated by reference herein.

TECHNICAL FIELD

Embodiments of the present invention relate to the programming of memories.

BACKGROUND

SONOS (silicon-oxide-nitride-oxide-silicon) is a nonvolatile, trapped-charge semiconductor memory technology that provides several advantages over conventional floating-gate flash memories, including immunity from single point failures and programming at lower voltages. In contrast to floating-gate devices, which store charge on a conductive gate, SONOS devices trap charge in a dielectric layer. SONOS transistors are programmed and erased using a quantum mechanical effect known as uniform channel, modified Fowler-Nordheim tunneling. This method of programming and erase is known in the art to provide better reliability than other methods such as hot carrier injection. A SONOS transistor is an insulated-gate field effect transistor (IGFET) with a charge-trapping dielectric stack between a conventional control gate and a channel in the body or substrate of the transistor. A SONOS transistor can be fabricated as a P-type or N-type IGFET using CMOS (complementary metal-oxide-semiconductor) fabrication methods.

A SONOS transistor is programmed or erased by applying a voltage of the proper polarity, magnitude and duration between the control gate and the substrate. A positive gate-to-substrate voltage causes electrons to tunnel from the channel to a charge-trapping dielectric layer and a negative gate-to-channel voltage causes holes to tunnel from the channel to the charge-trapping dielectric layer. In one case, the threshold voltage of the transistor is raised and in the other case, the threshold voltage of the transistor is lowered. The threshold voltage is the gate-to-source voltage that causes the transistor to conduct current when a voltage is applied between the drain and source terminals. For a given amount of trapped charge, the direction of the threshold voltage change depends on whether the transistor is an N-type or P-type FET. However, cell disturbs may interfere with the programming of such transistors.

BRIEF DESCRIPTION OF THE DRAWINGS

Embodiments of the present invention are illustrated by way of example and not by way of limitation in the figures of the accompanying drawings, in which:

FIG. 1D illustrates the effect of pass gate disturb in a floating source line SONOS memory cell, in accordance with an embodiment of the present invention;

DETAILED DESCRIPTION

An embodiment described herein includes a non-volatile trapped-charge memory having reduced cell disturbs. In the following description, numerous specific details are set forth such as examples of specific components, devices, methods, etc., in order to provide a thorough understanding of embodiments of the present invention. It should be apparent, however, to one skilled in the art that these specific details need not be employed to practice embodiments of the present invention. In other instances, well-known materials or methods have not been described in detail in order to avoid unnecessarily obscuring embodiments of the present invention.

Embodiments of the present invention are described herein using SONOS memory devices as examples of non-volatile trapped-charge memory devices for ease of description. However, embodiments of the invention are not so limited and may include any type of non-volatile, trapped-charge device.

Figure 1A:
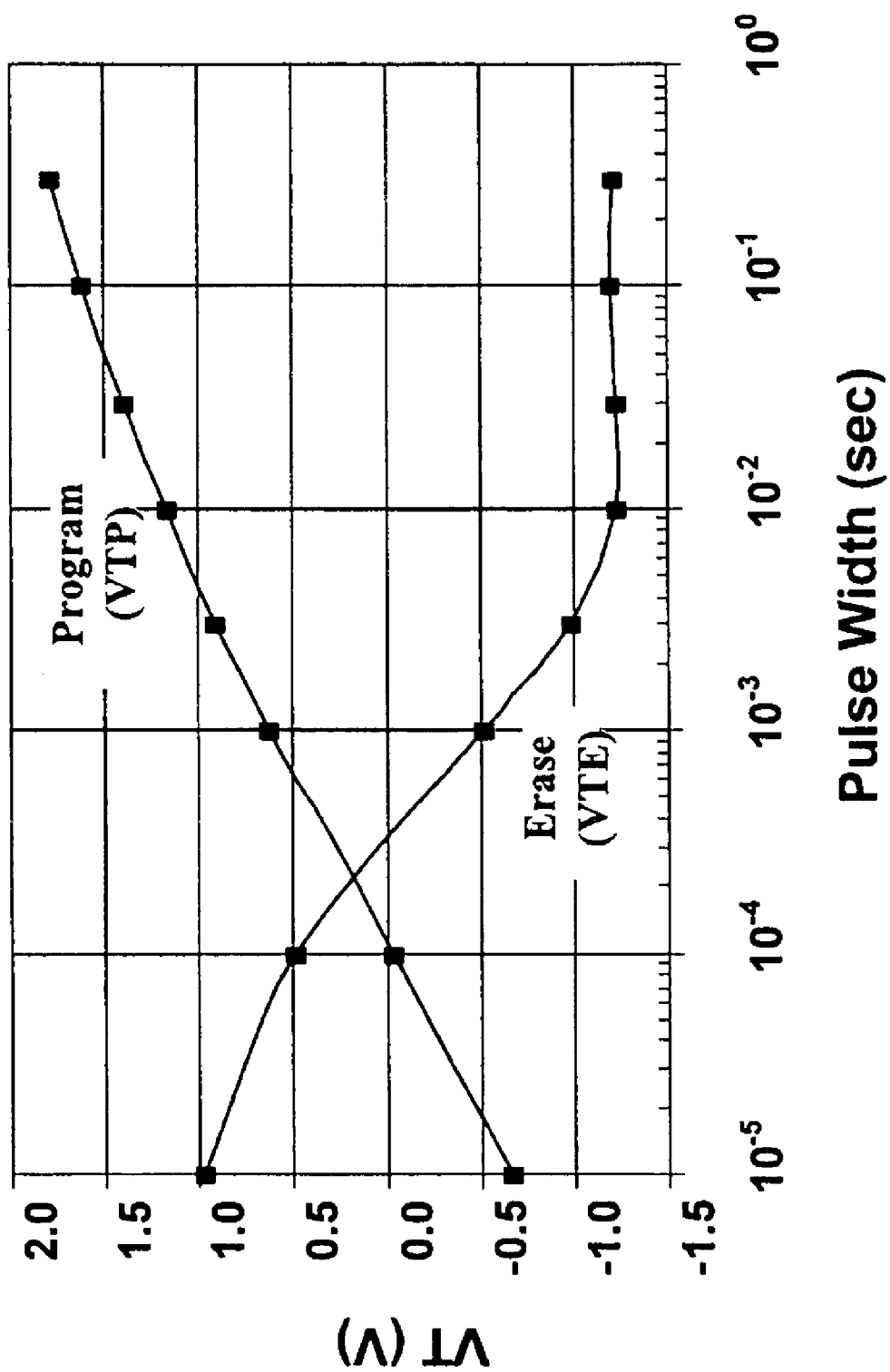
FIG. 1A illustrates programming and erase threshold voltages in a SONOS transistor, in accordance with an embodiment of the present invention.

FIG. 1A illustrates the change in threshold voltage $V_T$ of an N-type SONOS transistor as a function of time for a programming voltage pulse of +10 volts and an erase voltage pulse of −10 volts, in accordance with an embodiment of the present invention. After approximately 10 milliseconds, the programmed threshold voltage is greater than +1 volt and the erased threshold is less than −1 volt. After a programming or erase operation is completed, the state of the transistor can be read by setting the gate-to-source voltage to zero, applying a small voltage between the drain and source terminals, and sensing the current that flows through the transistor. In the programmed state, the N-type SONOS transistor may be OFF because the gate-to-source voltage may be below the programmed threshold voltage $V_{TP}$. In the erased state, the N-type SONOS transistor may be ON because the gate-tosource voltage may be above the erased threshold voltage $V_{TE}$. Typically, the ON state is associated with a logical "0" and the OFF state is associated with a logical "1."

Figure 1B:
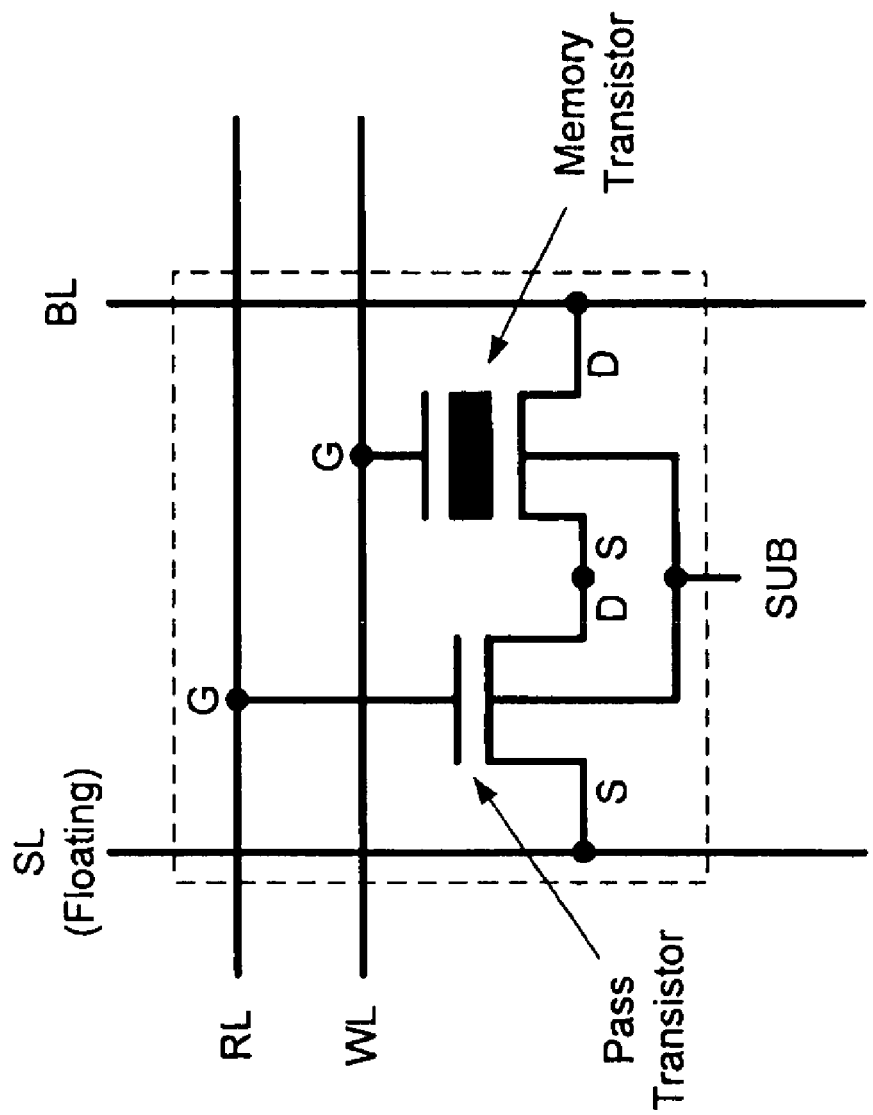
FIG. 1B illustrates a floating source line two-transistor (2T) SONOS memory cell, in accordance with an embodiment of the present invention.

FIG. 1B is a schematic of a memory cell in an array of two-transistor (2T) memory cells, in accordance with an embodiment of the present invention. The memory cell in FIG. 1B includes an IGFET pass transistor and a SONOS memory transistor, in accordance with an embodiment of the present invention. The cell includes a write line (WL) connected to the gate of the memory transistor that is used during write operations on the cell. The cell also includes a read line (RL) connected to the gate of the pass transistor that is used to select the cell for a data readout. The drain of the memory transistor is connected to a bit line (BL) and the source of the pass transistor is connected to a source line that is in a floating condition during write operations. The source of the memory transistor and the drain of the pass transistor share a common connection. The pass transistor and the memory transistor also share a common substrate.

Figure 1C:
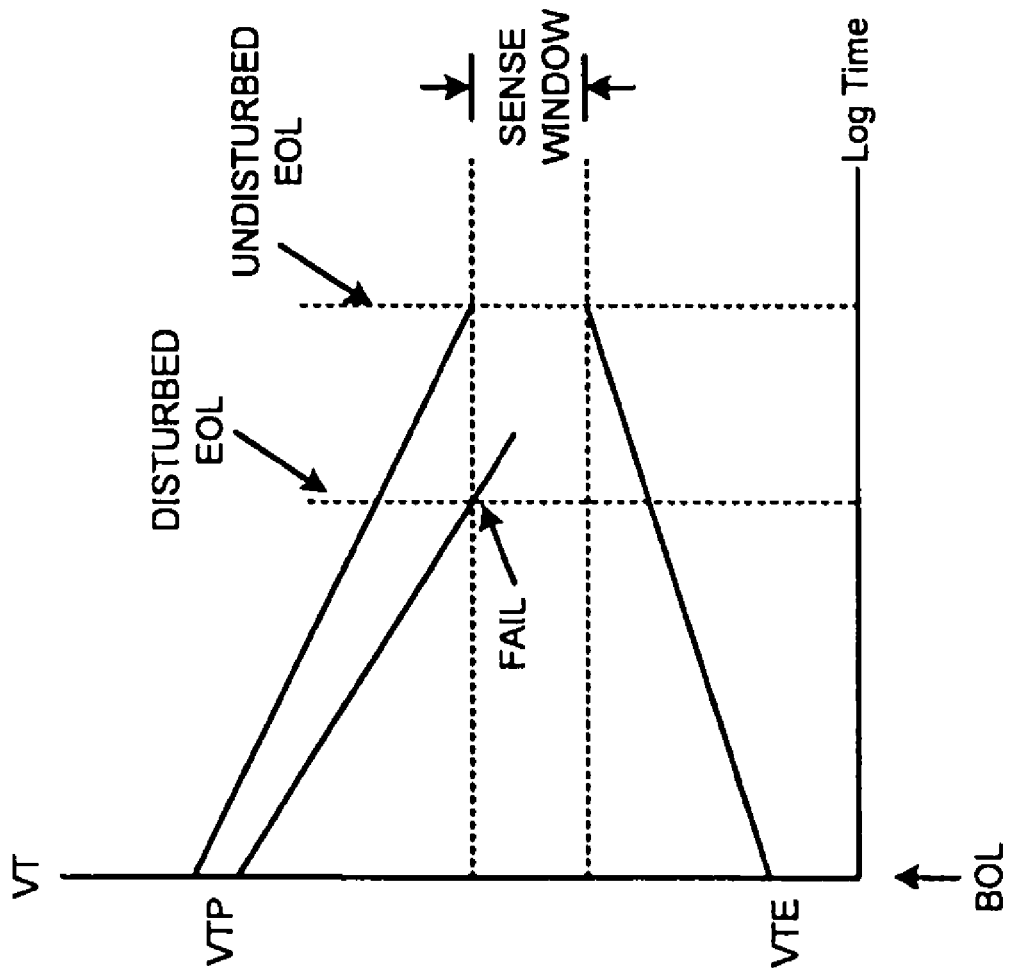
FIG. 1C illustrates the effect of bit line disturb in a floating source line (2T) SONOS memory cell, in accordance with an embodiment of the present invention.

The reliability of non-volatile memories is measured by their endurance (number of write cycles), data retention (the time period that the memory can maintain an unambiguous data state) and the repeatability of sense currents during data readout operations. Conventional memories, based on a floating source line memory cell like that illustrated in FIG. 1B, are subject to certain disturbances that degrade the performance of the memory over time. These disturbances, describe in greater detail below, include "bit line disturb" and "pass gate disturb." FIG. 1C is a graph illustrating the effects of bit line disturb on a floating source line memory cell. FIG. 1C compares the data retention of an undisturbed SONOS memory cell and a programmed SONOS memory cell after 1,000,000 bit line disturbs.

In FIG. 1C, the undisturbed SONOS cell exhibits a large initial separation at its beginning of life (BOL) between its programmed and erased threshold voltages. Over time, charge leakage causes the programmed threshold voltage to decrease and the erased threshold voltage to increase. A sense window for reading the cell (defined as the minimum threshold voltage that reliably represents a "1" and the maximum threshold voltage that reliable represents a "0") is positioned to maximize the time to the end of life (EOL) of the cell, so that on average the programmed threshold voltage and erased threshold voltage decay to their respective sense window limits at the same time. In the case of the disturbed cell, however, the BOL value of the programmed threshold voltage is reduced by the cumulative effect of bit line disturbs during cycling, and the rate of decay is increased because each bit line disturb may cause some damage to the tunneling layer that increases the charge leakage rate.

FIG. 1D illustrates the effect of pass gate disturb on the read current of a floating source line memory cell as a function of the number of write cycles, in accordance with an embodiment of the present invention. In an undisturbed cell, the threshold voltage of the pass transistor is fixed, (e.g., in the range of 0.7 to 1.2 volts) so when a given bias voltage is applied between the gate and source of the pass transistor (e.g., 2 volts), it may have a predictable and constant on resistance. When a specified read voltage is applied between the bit line and source line of the cell (e.g., 1 volt), and the memory transistor is in an erased state (i.e., conducting), the read current through the cell may be predictable and constant (e.g., 20 microamps as in FIG. 1D). As a result, it may be easy to distinguish a "1" from a "0" based on the read current of the cell compared to the leakage current of the cell when the cell is programmed and the memory transistor is off. As described in greater detail below, pass gate disturb causes an increase in the threshold voltage of the pass transistor, so when the given bias voltage is applied to the pass transistor it may turn on less and have a higher on resistance. At the specified read voltage, the read current may be reduced (e.g., to 1 microamp as in FIG. 1D) and it may not be possible to distinguish the read current in the erased state from leakage current in the programmed state, and a data read error may occur.

Figure 2A:
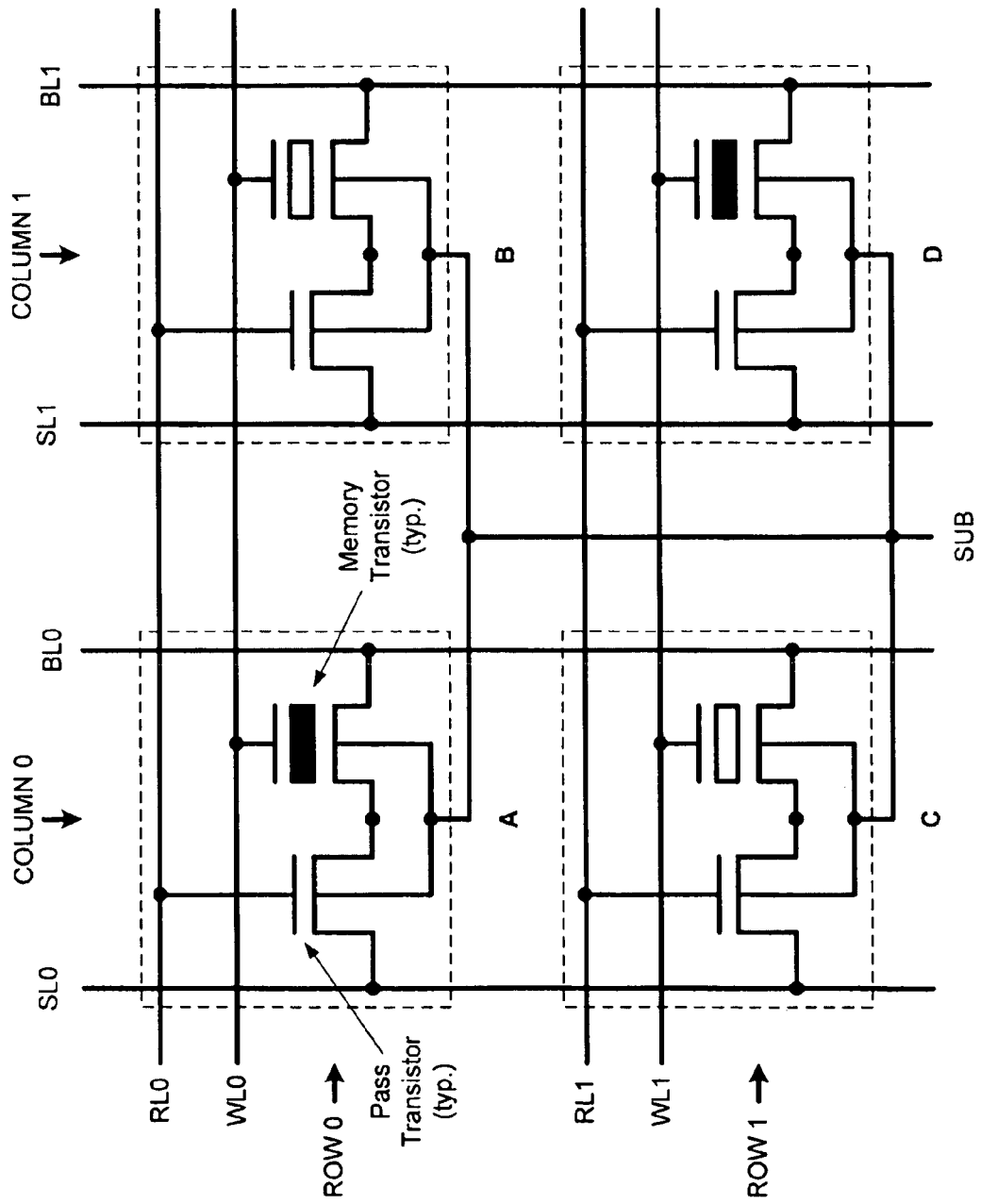
FIG. 2A illustrates a floating source line SONOS memory array, in accordance with an embodiment of the present invention.

FIG. 2A illustrates an array of two transistor (2T) N-type SONOS memory cells with floating source lines, in accordance with an embodiment of the present invention. The array contains four memory cells (A, B, C, D) in two rows (Row 0, Row 1) and two columns (Column 0, Column 1). Each cell includes an IGFET pass transistor and a SONOS memory transistor. In FIG. 2A, memory cells A and D are assumed to be programmed (indicated by shading of the memory transistor) and cells B and C are assumed to be erased. Each row includes a write line (WL0, WL1) that is used to perform write operations on a selected row of memory transistors. Each row also includes a read line (RL0, RL1) that is used to select a row for data readout. All the cells share a common substrate voltage (SUB). Each column includes a floating source line (SL0, SL1) connected to the source side of all the pass transistors in the column and a bit line (BL0, BL1) connected to the drain side of all the memory transistors in the column. The drain of the pass transistor and source of the memory transistor share a common node in each cell. Like other types of non-volatile memory, read and write operations in SONOS-type memories are performed on a row by row basis.

Figure 2B:
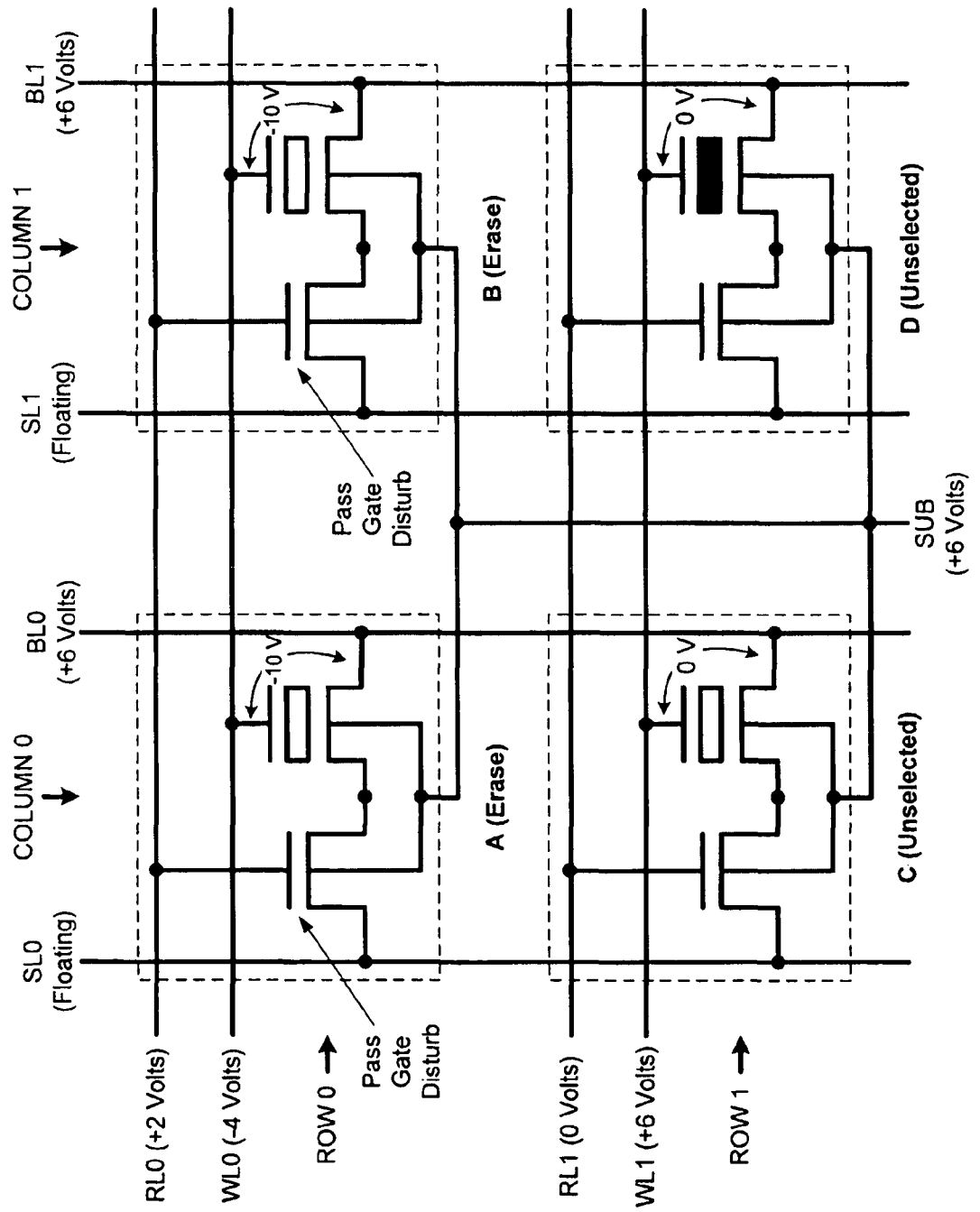
FIG. 2B illustrates a bulk erase operation in a floating source line SONOS memory array, in accordance with an embodiment of the present invention.

A write operation includes a bulk erase operation performed on a row, followed by a program or inhibit operation performed on individual cells in the row. FIG. 2B illustrates a bulk erase operation on ROW 0 of the array, in accordance with an embodiment of the present invention. For this operation, source lines SL0 and SL1 are allowed to float, +6 volts is applied to bit lines BL0 and BL1, to substrate SUB and write line WL1, and −4 volts is applied to write line WL0. These bias conditions place −10 volts across the memory transistors in ROW 0, which is sufficient to erase any programmed transistor in ROW 0. During this operation, the voltage across the memory transistors in cells C and D is 0 volts, so that cell C in an erased state, remains erased, and cell D in a programmed state, remains programmed.

Figure 2C:
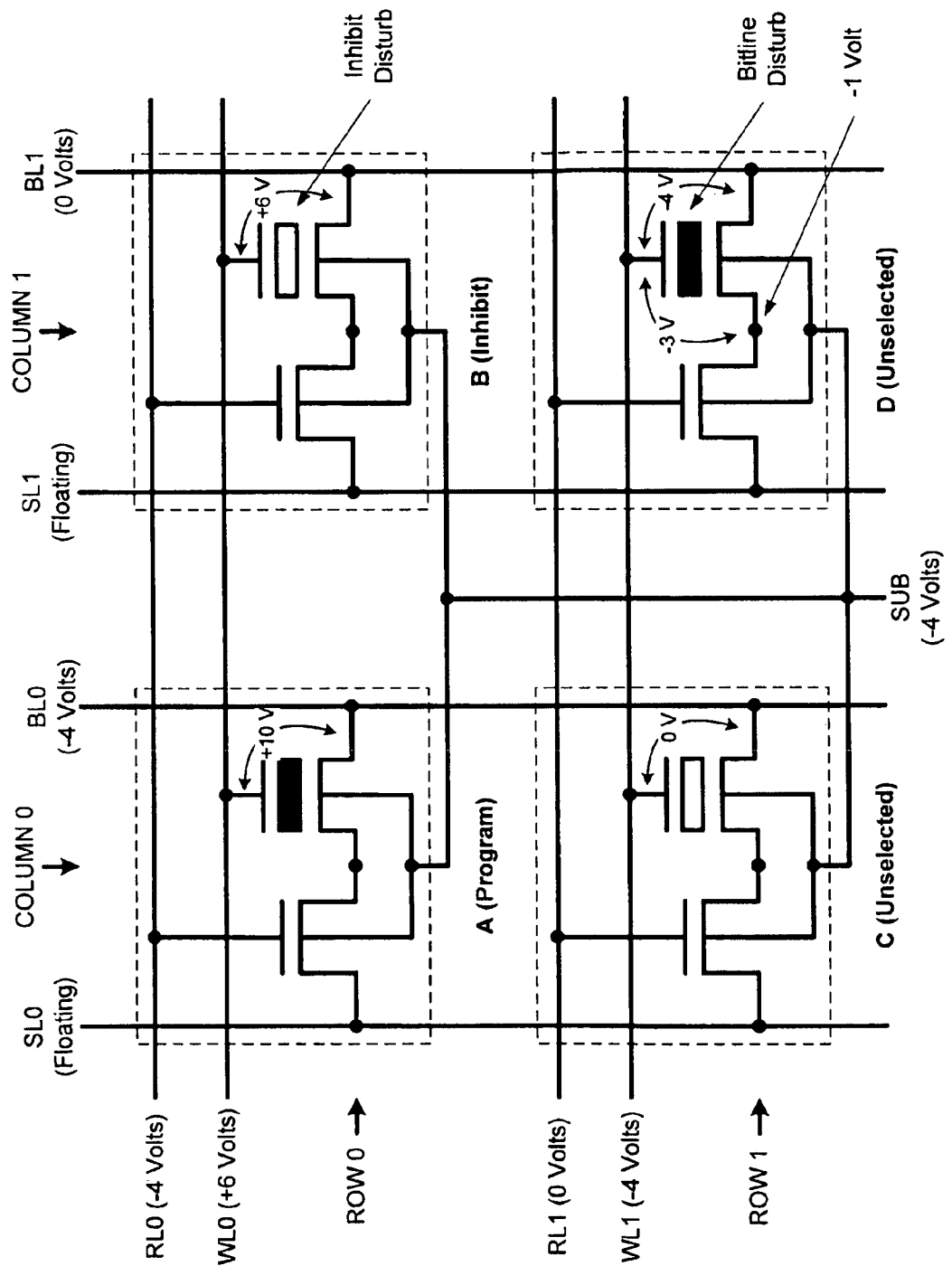
FIG. 2C illustrates a write operation in a floating source line SONOS memory array, in accordance with an embodiment of the present invention.

Writing data to a row after bulk erasing the row consists of programming erased memory transistors in cells that are to store a "1" and inhibiting the programming of erased memory transistors in cells that are to store a "0." FIG. 2C illustrates a conventional write operation where cell A is being programmed and cell B is being inhibited. For this operation, source lines SL0 and SL1 are again allowed to float, +6 volts is applied to write line WL0, −4 volts is applied to read lines RL0, write line WL1 and bit line BL0. The inhibit function in cell B is accomplished applying 0 volts to bit line BL1.

These bias conditions place +10 volts across the memory transistor in cell A, which is sufficient to program the memory transistor. In cell B, however, there is only a +6 volt potential across the memory transistor because its gate is at +6 volts, its drain is at 0 volts, and its source is also at 0 volts because the transistor is "on" in the erased state and its drain to source voltage is approximately 0. The reduced voltage across the memory transistor in cell B is not sufficient to program the memory transistor. However, some electrons do tunnel to the charge storage layer and the threshold voltage is shifted positively. This positive threshold shift is known as soft programming or "inhibit disturb" in the context of a memory write operation.

In ROW 1, these bias conditions place 0 volts across the memory transistor in cell C, so that it is undisturbed. In cell D, however, there is a −4 volt gate-to-drain potential on the memory transistor. Additionally, the floating source line SL1 couples any voltage on the source of the pass transistor in cell B to the source of the pass transistor in cell D. For the bias conditions shown in FIG. 2C, the source of the pass transistor in cell B exhibits a transient voltage of approximately −3 volts (approximately 1 volt above the −4 volt gate voltage). This voltage is coupled to the source of the pass transistor in cell D where, in combination with a 0 volt gate voltage on the pass transistor in cell D, it subjects the pass transistor in cell D to a turn-on transient. As a result, the drain of the pass transistor in cell D exhibits a transient voltage of approximately −1 volt. This voltage is impressed on the source of the memory transistor of cell D, producing a transient gate-to-source voltage across the memory transistor of approximately −3 volts. These voltages (gate-to-drain and gate-to-source) are not sufficient to erase the transistor, but some holes do tunnel to the charge storage layer from the gate, drain and channel of the memory transistor and the threshold voltage is shifted negatively. This negative shift in threshold voltage is known as soft erase or "bit line disturb" in the context of a memory write operation.

The maximum number of consecutive inhibit disturbs on an erased cell is limited to one (1) because the cell is always erased during the first part of a write operation. In contrast, the maximum number of consecutive bit line disturbs on a programmed cell in a given row and column is the total number of write operations on all other rows where an inhibit voltage is applied to the bit line on the given column. For example, if there are 64 rows in a memory array, and each row is written to (cycled) 100,000 times, then the maximum number of bit line disturbs that can be seen by the programmed cell is equal to [(6−1)*100,000], which equals 6,300,000 bit line disturbs. This means, statistically, that shifts in programmed threshold voltages are the limiting factor in SONOS memories.

Figure 2D:
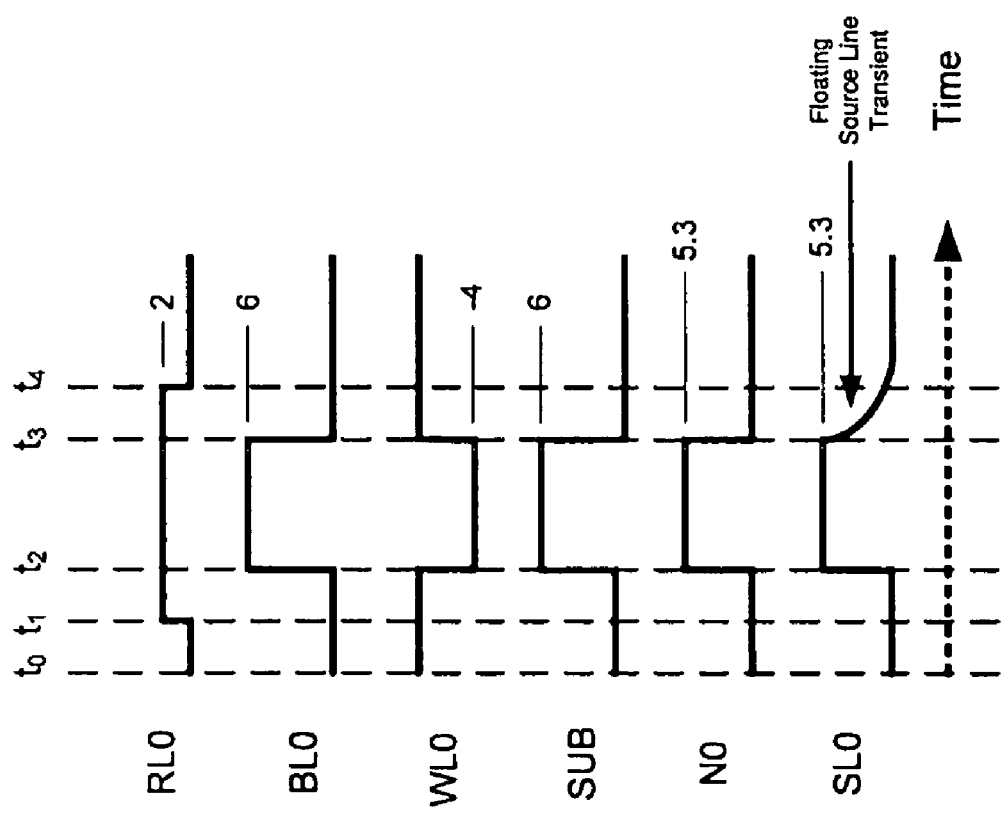
FIG. 2D illustrates pass gate disturb in a floating source line SONOS memory array, in accordance with an embodiment of the present invention.

As noted above, there is also another source of disturbance associated with floating source lines known as pass gate disturb. This disturbance occurs during the bulk erase operation described above and illustrated in FIG. 2B. FIG. 2D illustrates the voltages in cell A during a bulk erase operation, in accordance with an embodiment of the present invention. At t1, read line RL0 is pulsed to +2 volts. At t2, bit line BL0 and the substrate voltage SUB are pulsed to +6 volts and write line WL0 is pulsed to −4 volts. These conditions create a voltage pulse at the floating node N0 between the pass transistor and the memory transistor, which is capacitively coupled to the floating source line SL0. At t3, when the pulsed voltages on BL0, WL0 and SUB return to zero, the voltage at N0 returns to zero and the voltage on SL0 decays to zero with an RC time constant determined by the distributed capacitance and resistance on SL0. When the decay transient begins, there is a drain-to-source voltage across the pass transistor. This voltage injects hot electrons into the channel of the pass transistor, which raises the threshold voltage of the pass transistor as described above, causing a pass gate disturb which may limit cell read current-reducing reliability.

Figure 3:
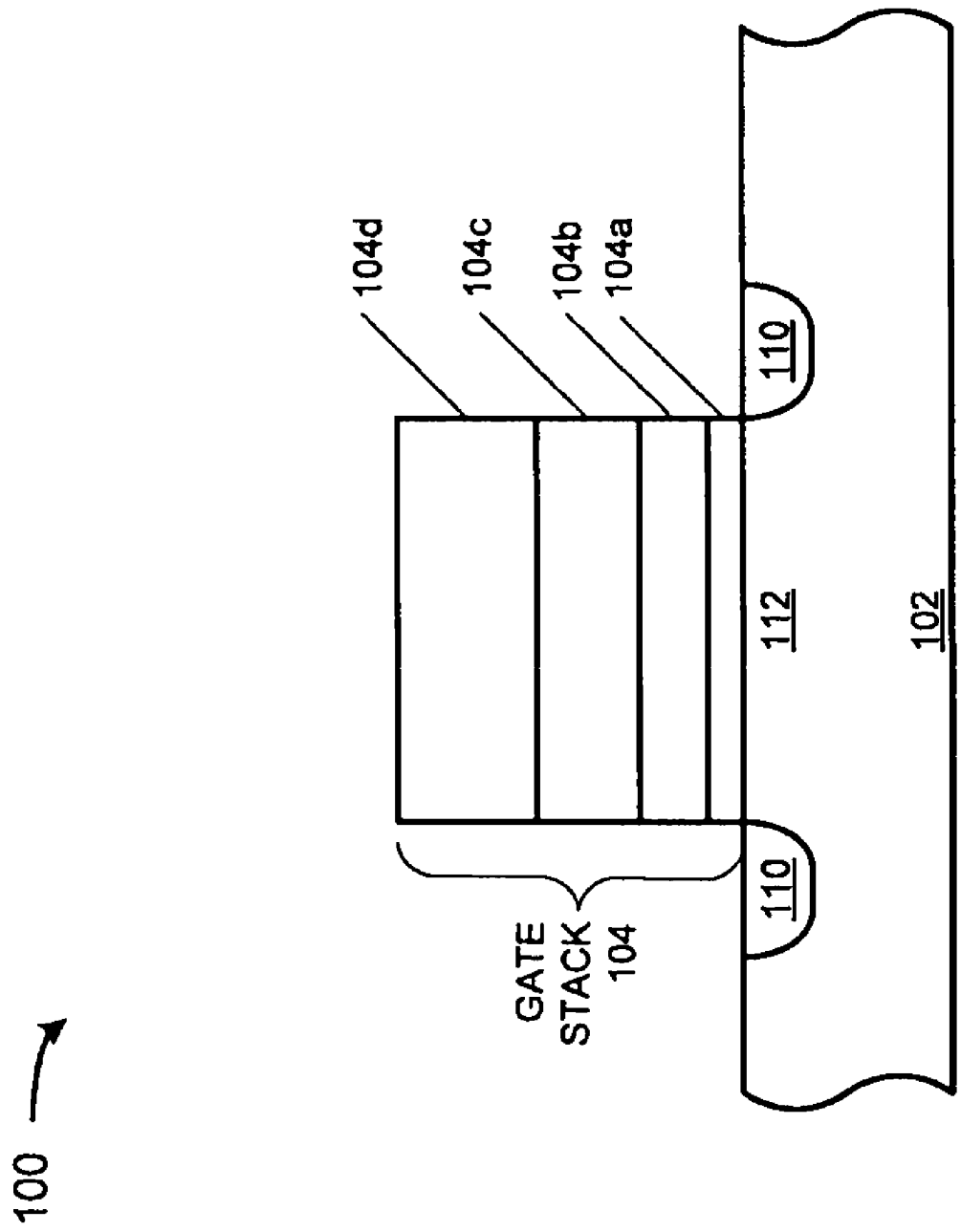
FIG. 3 illustrates the structure of a nonvolatile, SONOS-type trapped-charge semiconductor device in one embodiment of the invention.

FIG. 3 illustrates one embodiment of a non-volatile trapped-charge semiconductor device 100. Semiconductor device 100 includes a gate stack 104 formed over a substrate 102. Semiconductor device 100 further includes source/drain regions 110 in substrate 102 on either side of gate stack 104, which define a channel region 112 in substrate 102 underneath gate stack 104. Gate stack 104 includes a tunnel dielectric layer 104A, a charge-trapping layer 104B, a top dielectric layer 104C and a gate layer 104D. Gate layer 104D is electrically isolated from substrate 102 by the intervening dielectric layers.

Semiconductor device 100 may be any nonvolatile trapped-charge memory device. In accordance with one embodiment of the present invention, semiconductor device 100 is a SONOS-type device wherein the charge-trapping layer is an insulating dielectric layer having a concentration of charge-trapping sites. By convention, SONOS stands for "Silicon-Oxide-Nitride-Oxide-Silicon," where the first "Silicon" refers to the gate layer material, the first "Oxide" refers to the top dielectric layer (also known as a blocking dielectric layer), "Nitride" refers to the charge-trapping dielectric layer, the second "Oxide" refers to the tunnel dielectric layer and the second "Silicon" refers to the channel region. A SONOS-type device, however, is not limited to these specific materials.

Substrate 102 and, hence, channel region 112, may be any material suitable for semiconductor device fabrication. In one embodiment, substrate 102 may be a bulk substrate of a single crystal of a material which may include, but is not limited to, silicon, germanium, silicon/germanium or a III-V compound semiconductor material. In another embodiment, substrate 102 may be a bulk layer with a top epitaxial layer. In a specific embodiment, the bulk layer may be a single crystal of a material which may include, but is not limited to, silicon, germanium, silicon/germanium, a III-V compound semiconductor material and quartz, while the top epitaxial layer may be a single crystal layer which may include, but is not limited to, silicon, germanium, silicon/germanium and a III-V compound semiconductor material. In another embodiment, substrate 102 may be a top epitaxial layer on a middle insulator layer which is above a lower bulk layer. The top epitaxial layer may be a single crystal layer which may include, but is not limited to, silicon (e.g., to form a silicon-on-insulator semiconductor substrate), germanium, silicon/germanium and a III-V compound semiconductor material. The insulator layer may include, but is not limited to, silicon dioxide, silicon nitride and silicon oxy-nitride. The lower bulk layer may be a single crystal which may include, but is not limited to, silicon, germanium, silicon/germanium, a III-V compound semiconductor material and quartz. Substrate 102 and, hence, channel region 112, may include dopant impurity atoms. In a specific embodiment, channel region 112 is doped P-type and, in an alternative embodiment, channel region 112 is doped N-type.

Source/drain regions 110 in substrate 102 may be any regions having opposite conductivity to channel region 112. For example, in accordance with an embodiment of the present invention, source/drain regions 110 are N-type doped regions while channel region 112 is a P-type doped region. In one embodiment, substrate 102 and, hence, channel region 112, may be boron-doped single-crystal silicon having a boron concentration in the range of $10^{15}$ to $10^{19}$ atoms/cm$^3$. Source/drain regions 110 may be phosphorous-doped or arsenic-doped regions having a concentration of N-type dopants in the range of $5\times10^{16}$ to $5\times10^{19}$ atoms/cm$^3$. In a specific embodiment, source/drain regions 110 may have a depth in substrate 102 in the range of 80 to 200 nanometers. In accordance with an alternative embodiment of the present invention, source/drain regions 110 are P-type doped regions while channel region 112 is an N-type doped region.

Tunnel dielectric layer 104A may be any material and have any thickness suitable to allow charge carriers to tunnel into the charge-trapping layer under an applied gate bias. In one embodiment, tunnel dielectric layer 104A may be a silicon dioxide or silicon oxy-nitride layer formed by a thermal oxidation process. In another embodiment, tunnel dielectric layer 104A may be a high dielectric constant (high-k) material formed by chemical vapor deposition or atomic layer deposition and may include, but is not limited to, hafnium oxide, zirconium oxide, hafnium silicate, hafnium oxy-nitride, hafnium zirconium oxide and lanthanum oxide. In a specific embodiment, tunnel dielectric layer 104A may have a thickness in the range of 1 to 10 nanometers. In a particular embodiment, tunnel dielectric layer 104A may have a thickness of approximately 2 nanometers.

Charge-trapping layer 104B may be any material and have any thickness suitable to store charge and, hence, modulate the threshold voltage of gate stack 104. In one embodiment, charge-trapping layer 104B may be a dielectric material formed by a chemical vapor deposition process and may include, but is not limited to, stoichiometric silicon nitride, silicon-rich silicon nitride and silicon oxy-nitride. In one embodiment, the thickness of charge-trapping layer 104B may be in the range of 5 to 10 nanometers.

Top dielectric layer 104C may be any material and have any thickness suitable to maintain a barrier to charge leakage and tunneling under an applied gate bias. In one embodiment, top dielectric layer 104C is formed by a chemical vapor deposition process and is composed of silicon dioxide or silicon oxy-nitride. In another embodiment, top dielectric layer 104C may be a high-k dielectric material formed by atomic layer deposition and may include, but is not limited to, hafnium oxide, zirconium oxide, hafnium silicate, hafnium oxy-nitride, hafnium zirconium oxide and lanthanum oxide. In a specific embodiment, top dielectric layer 104C may have a thickness in the range of 1 to 20 nanometers.

Gate layer 104D may be any conductor or semiconductor material suitable for accommodating a bias voltage during operation of the SONOS-type device. In accordance with an embodiment of the present invention, gate layer 104D may be doped poly-crystalline silicon formed by a chemical vapor deposition process. In another embodiment, gate layer 104D may be a metal-containing material formed by chemical or physical vapor deposition and may include, but is not limited to, metal nitrides, metal carbides, metal silicides, hafnium, zirconium, titanium, tantalum, aluminum, ruthenium, palladium, platinum, cobalt and nickel.

Figure 4A:
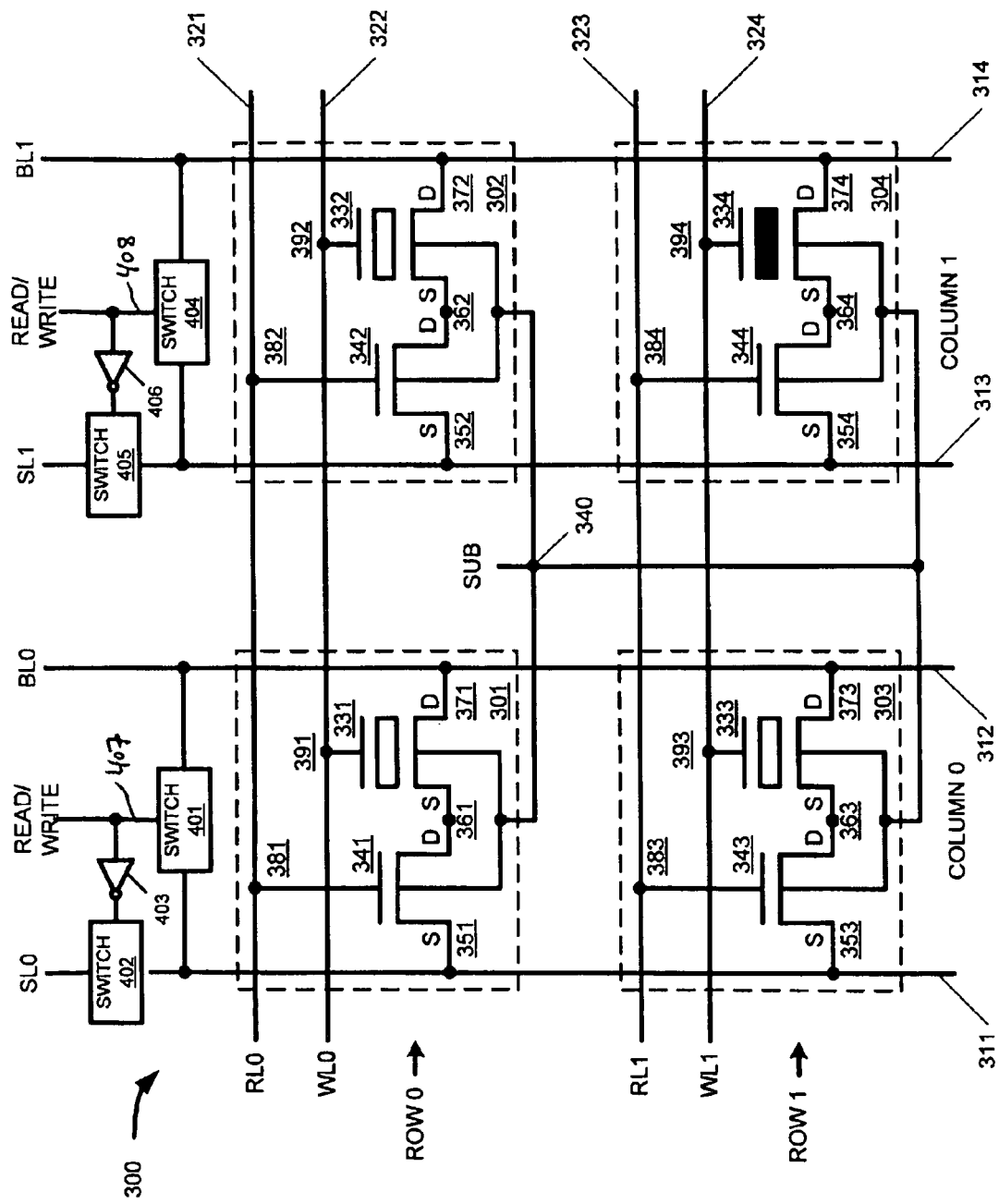
FIG. 4A illustrates a SONOS-type memory array in one embodiment of the invention.

FIG. 4A illustrates an exemplary segment of a memory 300 according to one embodiment of the invention, which may be part of a large array of memory cells. In FIG. 4A, memory 300 includes four memory cells 301, 302, 303 and 304 arranged in two rows (ROW 0, ROW 1) and two columns (COLUMN 0, COLUMN 1).

Cell 301 in ROW 0 and COLUMN 0 includes memory transistor 331 and pass transistor 341. The drain 371 of memory transistor 331 is connected to bit line 312 (BL0), the gate 391 of memory transistor 331 is connected to write line 322 (WL0) and the source of memory transistor 331 is connected to the drain of pass transistor 341 at common node 361. The gate 381 of pass transistor 341 is connected to read line 321 (RL0) and the source 351 of pass transistor 341 is connected to source line 311 (SL0).

Cell 302 in ROW 0 and COLUMN 1 includes memory transistor 332 and pass transistor 342. The drain 372 of memory transistor 332 is connected to bit line 314 (BL1), the gate 392 of memory transistor 332 is connected to write line 322 (WL0) and the source of memory transistor 332 is connected to the drain of pass transistor 342 at common node 362. The gate 382 of pass transistor 342 is connected to read line 321 (RL0) and the source 355 of pass transistor 342 is connected to source line 313 (SL1).

Cell 303 in ROW 1 and COLUMN 0 includes memory transistor 333 and pass transistor 343. The drain 373 of memory transistor 333 is connected to bit line 312 (BL0), the gate 393 of memory transistor 333 is connected to write line 324 (WL1) and the source of memory transistor 333 is connected to the drain of pass transistor 343 at common node 363. The gate 383 of pass transistor 343 is connected to read line 323 (RL1) and the source 353 of pass transistor 343 is connected to source line 311 (SL0).

Cell 304 in ROW 1 and COLUMN 1 includes memory transistor 334 and pass transistor 344. The drain 374 of memory transistor 334 is connected to bit line 314 (BL1), the gate 394 of memory transistor 334 is connected to write line 324 (WL1) and the source of memory transistor 334 is connected to the drain of pass transistor 344 at common node 364. The gate 384 of pass transistor 344 is connected to read line 323 (RL1) and the source 354 of pass transistor 344 is connected to source line 313 (SL1). In addition, all of the transistors in memory array 300 may share a common substrate node 340.

In COLUMN 0, source line 311 is coupled to switch 401 and switch 402, which may be any type of single-pole, single-throw semiconductor switch that is compatible with the fabrication processes used to manufacture memory array 300 (e.g., diode or transistor switches as are known in the art). Switch 401 is also coupled to bit line 312. Switch 401 is controlled by a READ/WRITE control signal on line 407. Switch 402 is controlled by the output of an inverter 403 that inverts the READ/WRITE control signal, such that when switch 401 is open, switch 402 is closed and when switch 401 is closed, switch 402 is open. COLUMN 1 of memory array 300 has a comparable switch configuration between its source line 313 and bit line 314, where switch 404, switch 405, and inverter 406 correspond to switch 401, switch 402, and inverter 403, respectively.

In the following description, for clarity and ease of explanation, it is assumed that all of the transistors in memory array 300 are N-type field effect transistors. It should be appreciated, without loss of generality that a P-type configuration can be described by reversing the polarity of the applied voltages, and that such a configuration is within the contemplated embodiments of the invention. In addition, the voltages used in the following description are selected for ease of explanation and represent only one exemplary embodiment of the invention. Other voltages may be employed in different embodiments of the invention.

Figure 4B:
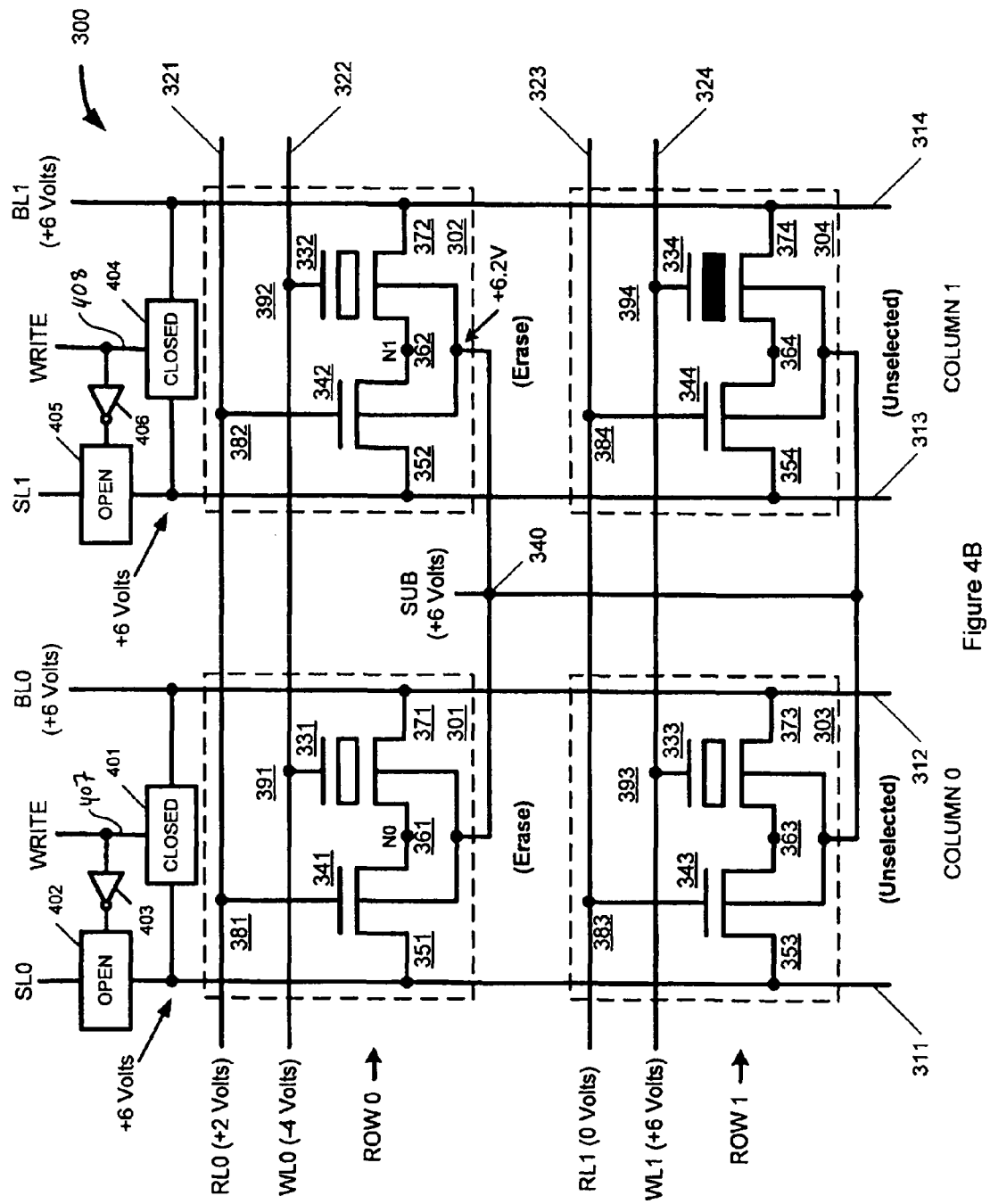
FIG. 4B illustrates a bulk erase operation in a SONOS-type memory array in one embodiment of the invention.

FIG. 4B illustrates a bulk erase operation on a selected row (ROW 0) in memory array 300, in one embodiment, that erases memory cell 301 and memory cell 302. In FIG. 4B, a WRITE signal is applied to control lines 407 and 408 that closes switch 401 and 404, and opens switches 402 and 405. In this configuration, source line 311 (SL0) is connected to and equipotential with bit line 312 (BL0), and source line 313 SL1) is connected to and equipotential with bit line 314 (BL1). A positive voltage pulse (+2 volts) is applied on read line 321 (RL0), a negative voltage pulse (−4 volts) is applied on write line 322 (WL0), and a positive voltage pulse (+6 volts) is applied on bit line 312 (BL0), bit line 314 (BL1) and the common substrate node 340 (SUB).

As a result of the applied voltages and the configuration of switches 401, 402, 403 and 404, pass transistors 341 and 342 are biased OFF and the source 351 of pass transistor 341 is clamped to bit line 312. Memory transistors 331 and 332 both have negative gate-to-substrate voltages and gate-to-drain voltages which are sufficient to cause holes to tunnel into their respective charge-trapping layers, erasing the memory transistors and rendering the transistors in an ON-state when the bias voltages are removed as described above. Unlike the floating source line erase operation described above, however, the floating source line transient is substantially eliminated because the source line voltages track their corresponding bit line voltages as illustrated in FIG. 4E, in accordance with an embodiment of the present invention. FIG. 4E is equivalent to FIG. 2D with the exception of the voltage on SL0, which transitions from +6 volts to 0 volts while the voltage at node N0 transitions from approximately +5.3 volts to 0 volts. As a result, the drain-to-source voltage on pass transistor 341 never exceeds approximately −0.7 volts, which is well below the threshold for hot electron injection, and pass gate disturb is substantially eliminated. It should be appreciated that an equivalent condition exists for pass transistor 342 in memory cell 302.

Figure 4C:
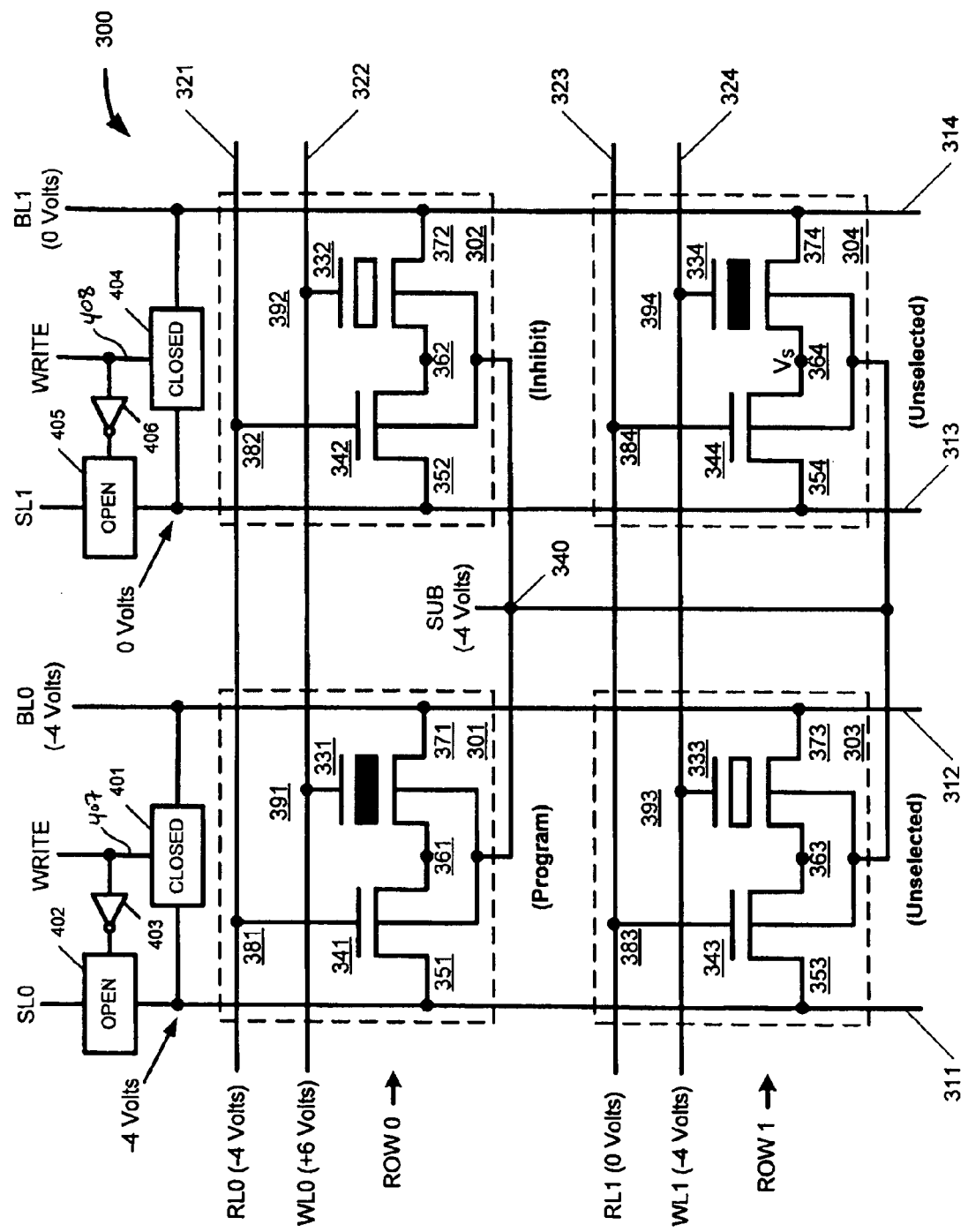
FIG. 4C illustrates a write operation in a SONOS-type memory array in one embodiment of the invention.

FIG. 4C illustrates a write operation on ROW 0 of memory array 300, according to one embodiment of the invention. In FIG. 4C, cell 301 is the targeted cell to be written to a logic "1" state and cell 302 is to written to a logic "0" state. However, since cell 302 is already erased to a logic "0" state by the preceding bulk erase operation (FIG. 4B), writing a logic "0" is equivalent to inhibiting cell 302 from programming. Here, as in FIG. 4B, a WRITE signal is applied to the control lines that close switches 401 and 404, and opens switches 402 and 405, such that source line 311 is connected to bit line 312 and source line 313 is connected to bit line 314. Additionally, −4 volts is applied to read line 321 (RL0), bit line 312 (BL0) and substrate 340 (SUB), +6 volts is applied to write line 322 (WL0) and an inhibit voltage of 0 volts is applied to bit line 314.

As a result of the applied voltages, pass transistor 341 is biased OFF with 0V gate-to-substrate and gate-to-source voltages. Memory transistor 331 is exposed to a gate-to-substrate and gate-to-drain voltage of approximately +10V, which is sufficient to cause electrons to tunnel to the charge trapping layer of memory transistor 302 and place memory transistor 331 in an OFF state when the bias voltage are removed.

In memory cell 302, pass transistor 342 is also biased off with a 0 volt gate-to-drain voltage and a −4 volt gate-to-source voltage. Memory transistor 332 is inhibited from programming by the application of the 0 volt inhibit voltage as described above.

In ROW 1, memory transistor 333 is unaffected by the programming operation on ROW 0 because its gate (393), drain (373) and source (363) terminals are all at the same potential (−4 volts). In memory cell 304, the source (354) of pass transistor 344 is clamped to 0 volts because source line 313 is connected to bit line 314 via switch 404. As a result, pass transistor 344 is biased OFF and there is no turn-on transient in pass transistor 344 to disturb memory transistor 334 and bit line disturb on memory transistor 334 is substantially reduced compared to a conventional floating source line SONOS-type memory.

Figure 4D:
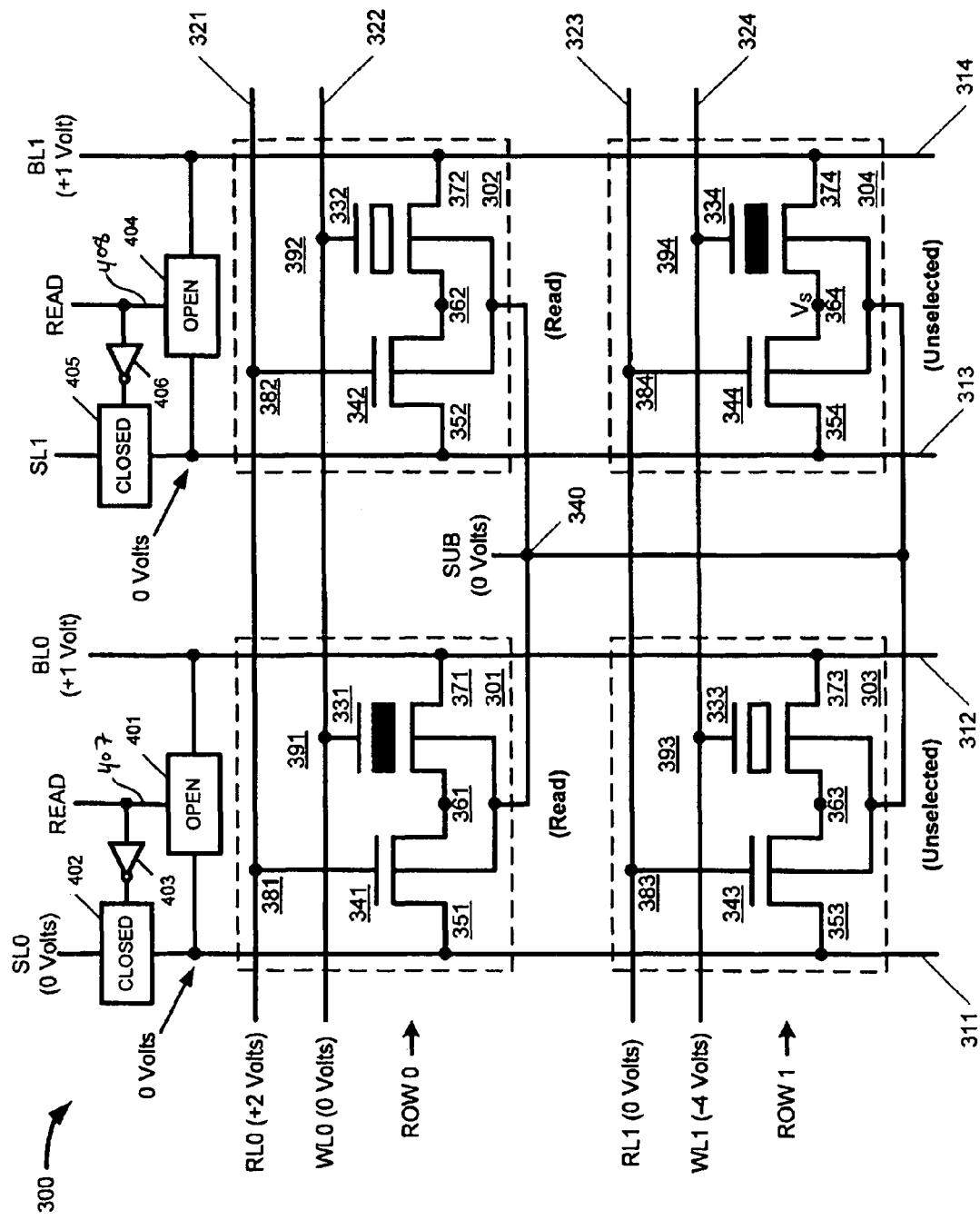
FIG. 4D illustrates a read operation in a SONOS-type memory array in one embodiment of the invention.
Figure 4E:
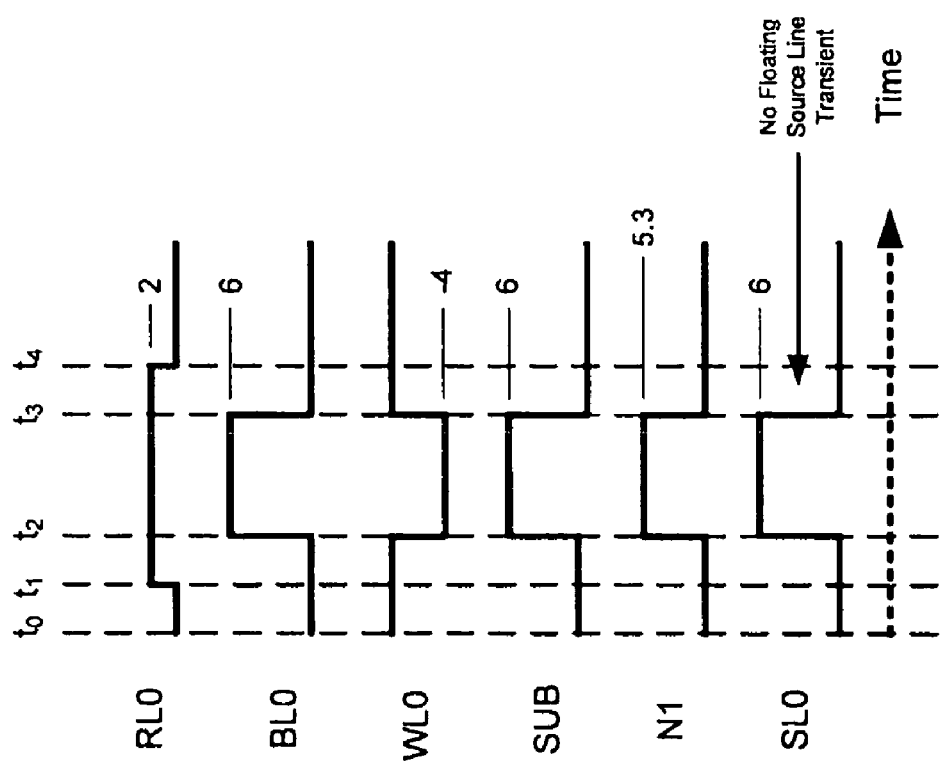
FIG. 4E illustrates reduction of pass gate disturb in one embodiment of the invention.

FIG. 4D illustrates how memory array 300 may be read in one embodiment. In FIG. 4D ROW 0 is selected for reading by the application of a select voltage (+2 volts) to read line 321 (RL0) which turns on pass transistors 341 and 342. A READ control signal is applied to the control lines that opens switches 401 and 404 and closes switches 402 and 405. Source lines SL0 and SL1 are grounded or otherwise held to a 0 volt potential. A sense voltage (e.g., +1 volt) is applied to each of bit lines BL0 and BL1 and the current that flows through their respective memory cells (301 and 302) may be sensed. Sense amplifiers and current sense methods are known in the art. Accordingly, a detailed description is not provided. In the exemplary memory array 300 of FIG. 4D, cell 301 is programmed (memory transistor 331 is OFF) and memory cell 302 is erased (memory transistor 332 is ON). Therefore, current will not flow through memory cell 301 and current will flow through memory cell 302.

Figure 5:
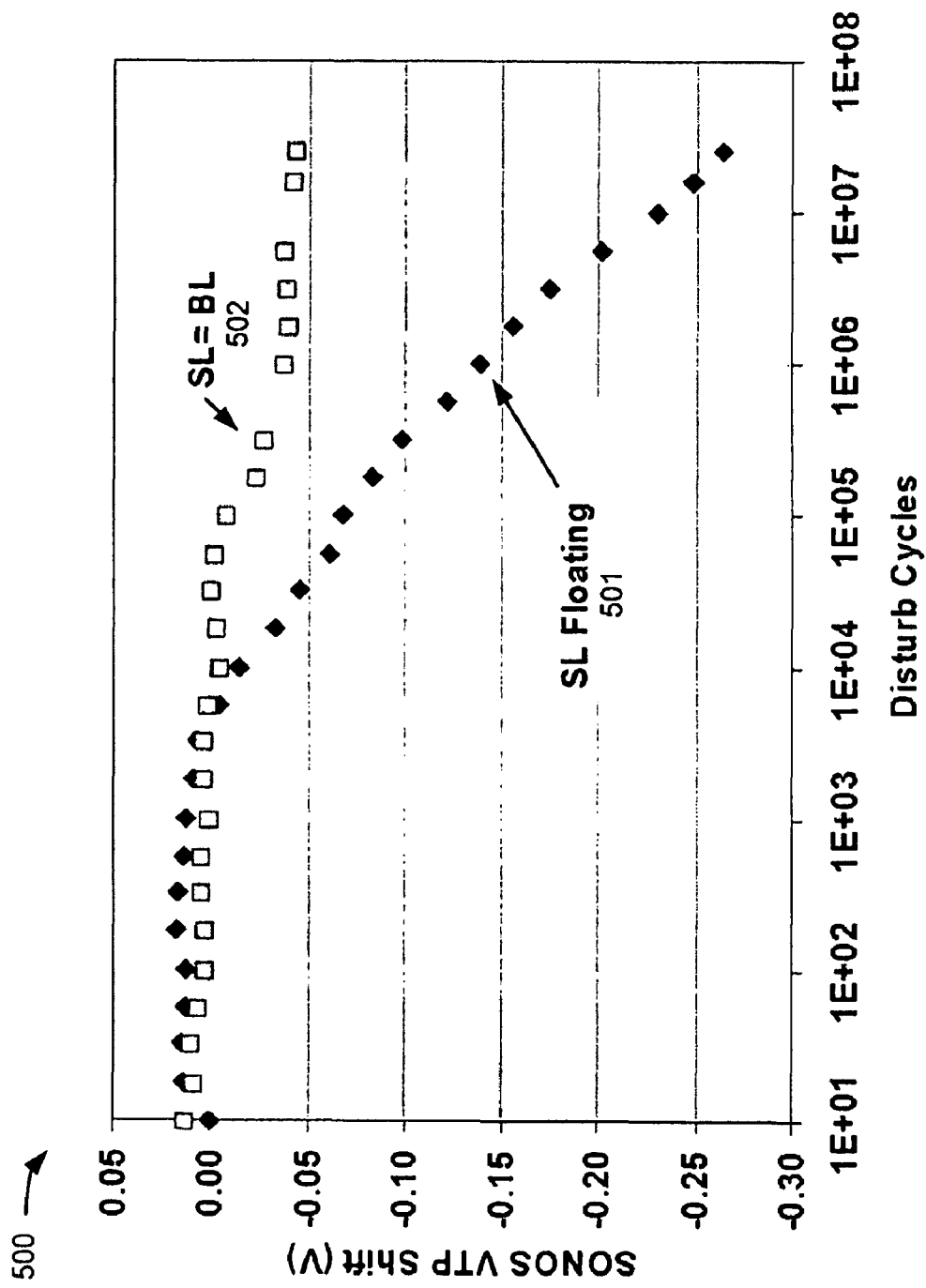
FIG. 5 illustrates a reduction of bit line disturb in one embodiment of the invention.

FIG. 5 is a graph 500 compared bit line disturb in a floating source line SONOS-type memory (data point set 501) over one million cycles to bit line disturb in a SONOS-type memory according to embodiments of the present invention (date point set 502) over one million cycles. As illustrated in FIG. 5, the total threshold voltage shift for curve 502 is less than 50 millivolts compared to almost 300 millivolts for the design with floating source lines.

Figure 6:
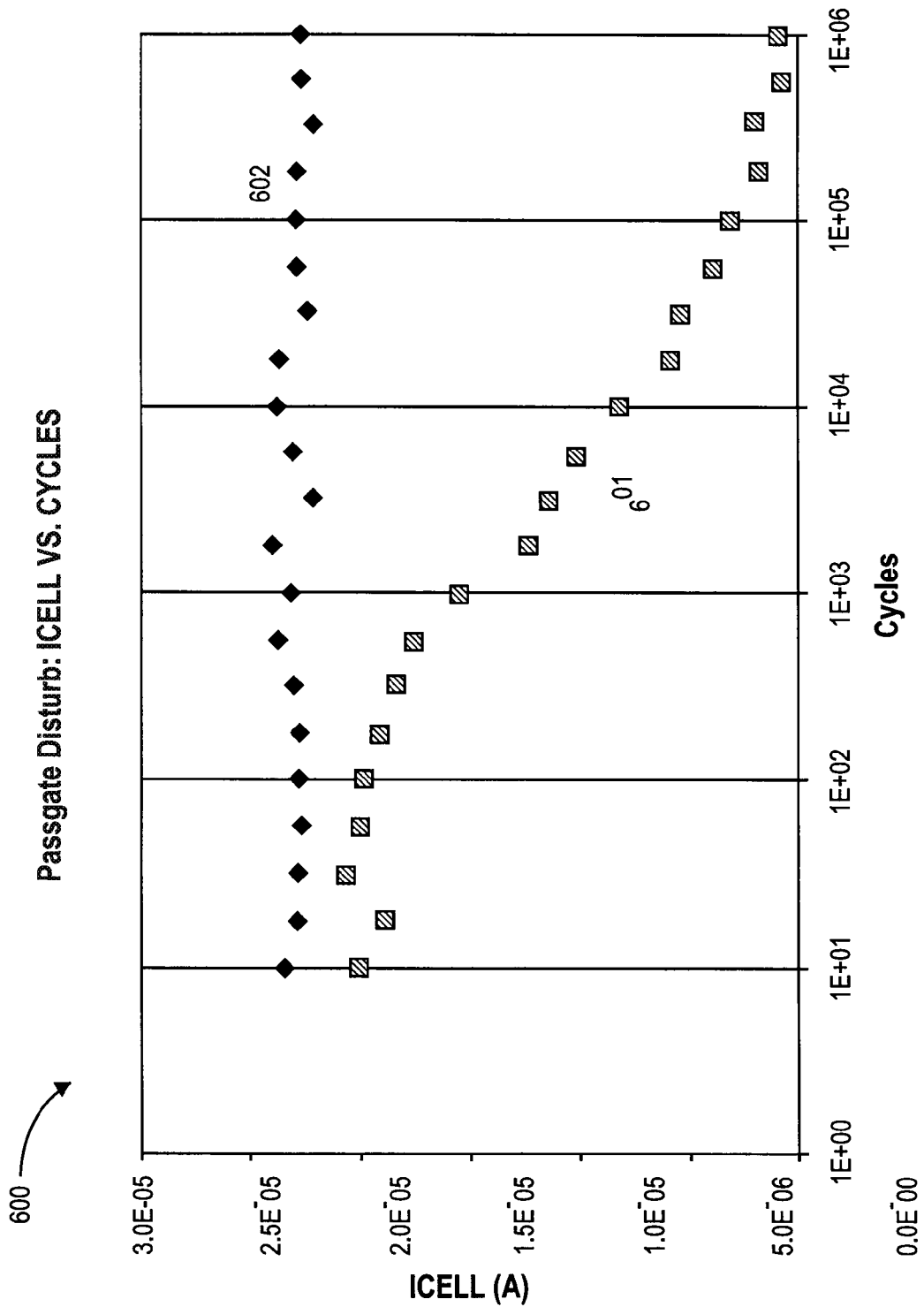
FIG. 6 illustrates a reduction of pass gate disturb in one embodiment of the present invention.

FIG. 6 is a graph 600 comparing read current (data point set 601) over one million cycles for a floating source line SONOS-type memory to the read current (data point set 602) over one million cycles according to embodiments of the present invention. As illustrated in FIG. 6, in accordance with an embodiment of the present invention, the read current for data set 602 is substantially unchanged compared to the read current for the floating source line configuration, which decreases from approximately 20 microamps to approximately one microamp as described above.

Figure 7:
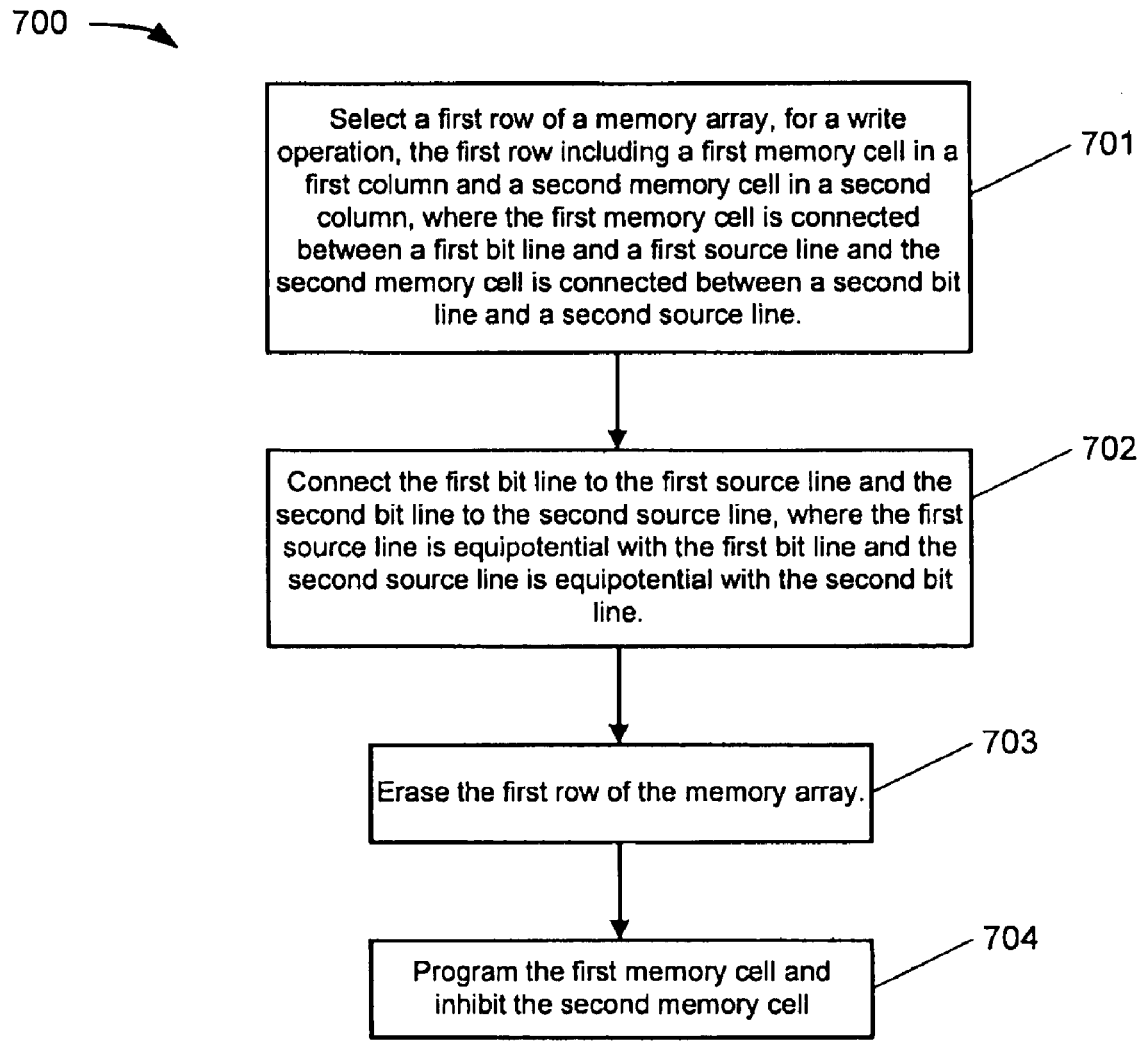
FIG. 7 is a flowchart illustrating a method for reducing SONOS cell disturbs in one embodiment.

FIG. 7 is a flowchart 700 illustrating a method for reducing pass gate disturb and bit line disturb in a SONOS-type memory array one embodiment. In FIG. 7, a first row of a memory array is selected for a write operation, where the first row includes a memory cell in a first column and a memory cell in a second column, where the first memory cell is connected between a first bit line and a first source line and the second memory cell is connected between a second bit line and a second source line (operation 701). In the next operation, the first bit line is connected to the first source line and the second bit line is connected to the second source line, where the first source line is equipotential with the first bit line and the second source line is equipotential with the second bit line (operation 702). The first row of the memory array is then erased (operation 703) and the first memory cell is programmed while the second memory cell is inhibited from programming (operation 704).

Figure 8:
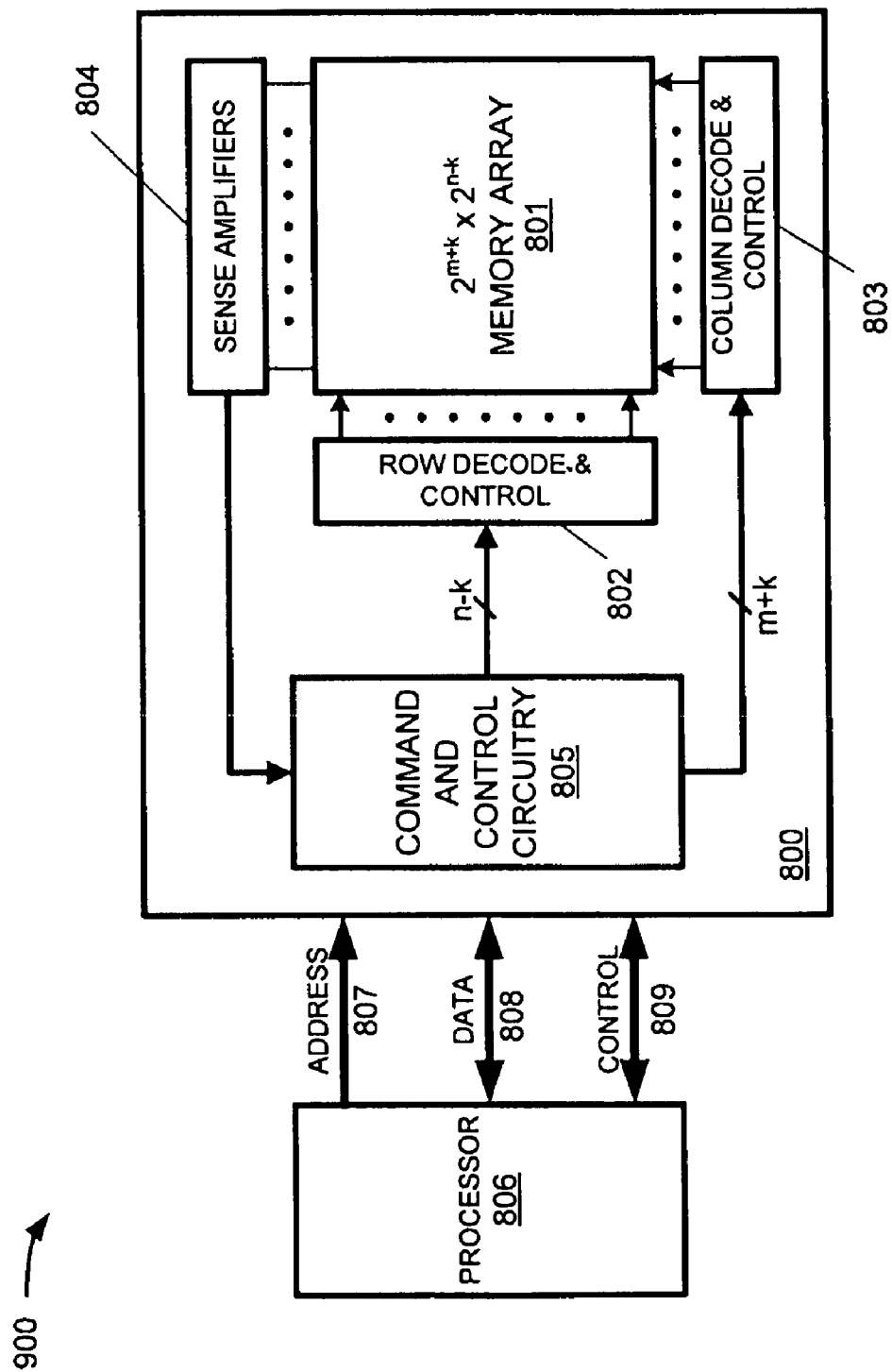
FIG. 8 is a block diagram illustrating a processing system in which embodiments of the invention may be implemented.

FIG. 8 is a block diagram of processing system 900 including a SONOS-type memory 800 according to one embodiment of the invention. In FIG. 8, the SONOS-type memory 800 includes a SONOS-type memory array 801, which may be organized as rows and columns of SONOS-type memory cells as described above. In one embodiment, memory array 801 may be an array of $2^{m+k}$ columns by $2^{n-k}$ rows of memory cells (such as memory cell 200) where k is the length of a data word in bits. Memory array 801 may be coupled to a row decoder and controller 802 via $2^{n-k}$ write lines (such as write lines 322 and 324) and by $2^{n-k}$ read lines (such as read lines 321 and 323) 802A as described above. Memory array 801 may also be coupled to a column decoder and controller 802 via $2^{m+k}$ source lines (such as source lines 311 and 313) and by $2^{m+k}$ bit lines (such as bit lines 321 and 323) 803A as described above. Row and column decoders and controllers are known in the art and, accordingly, are not described in detail herein. Column decoder and controller 802 may include switches such as switches 401 and 402 to connect and disconnect source lines and bit lines as described above to substantially eliminate pass gate disturbs and bit line disturbs as described above. Memory array 801 may also be coupled to a plurality of sense amplifiers 804 as are known in the art to read k-bit words from memory array 801. Memory 800 may also include command and control circuitry 805, as is known in the art, to control row decoder and controller 802, column decoder and controller 803 and sense amplifiers 804, and also to receive read data from sense amplifiers 804.

Memory 800 may also be coupled to a processor 806 via an address bus 807, a data bus 808 and a control bus 809. Processor 806 may be any type of general purpose or special purpose processing device, for example.

In one embodiment, row controller 802 may be configured to select a first row of the memory array 801 for a write operation and to deselect a second row of the memory 801 array from the write operation. The column controller 803 may be configured to select a first memory cell in the first row (e.g., cell 301) for programming and to inhibit a second memory cell in the first row (e.g., cell 302) from programming. The column controller 803 may be configured to connect a first source line to a first bit line shared by the first memory cell and a third memory cell (e.g., cell 304) in an unselected row of the memory array and to apply an erase voltage on the first bit-line followed by a programming voltage on the first bit line, wherein a pass gate disturb in the first memory cell is substantially eliminated. The column controller 803 may be configured to connect a second source line to a second bit line shared by the second memory cell and a fourth, programmed memory cell (e.g., cell 304) in an unselected row of the memory array and to apply an erase voltage on the second bit line followed by an inhibit voltage on the second bit-line, wherein a pass gate disturb in the second memory cell is substantially reduced and a bit line disturb in the fourth memory cell is substantially reduced.

Although embodiments of the present invention have been described with reference to specific exemplary embodiments, it will be evident that various modifications and changes may be made to these embodiments without departing from the broader spirit and scope of embodiments of the invention as set forth in the claims. Accordingly, the specification and drawings are to be regarded in an illustrative rather than a restrictive sense.

What is claimed is:

1. A method for reducing disturbs in an array of memory cells, comprising:
    selecting a first row of the array of memory cells for a write operation, the first row comprising a first memory cell in a first column of the array of memory cells and a second memory cell in a second column of the array of memory cells, wherein the first memory cell connected between a first bit line and a first source line and the second memory cell connected between a second bit line and a second source line, wherein each of the memory cells includes a memory transistor and a pass transistor;
    connecting the first bit line to the first source line and the second bit line to the second source line, wherein the first source line is equipotential with the first bit line and the second source line is equipotential with the second bit line; and
    erasing the first row of the array of memory cells.

2. The method of claim 1, further comprising programming the first memory cell and inhibiting the second memory cell.

3. The method of claim 2, wherein the second column includes a third memory cell in a second row of the array and the first column includes a fourth memory cell in the second row of the array of memory cells, wherein the third memory cell is connected between the second bit line and the second source line and the fourth memory cell is connected between the first bit line and the first source line.

4. A method for reducing disturbs in an array of memory cells, comprising:
    selecting a first row of the array of memory cells for a write operation, the first row comprising a first memory cell in a first column of the array of memory cells and a second memory cell in a second column of the array of memory cells, wherein the first memory cell connected between a first bit line and a first source line and the second memory cell connected between a second bit line and a second source line;
    connecting the first bit line to the first source line and the second bit line to the second source line, wherein the first source line is equipotential with the first bit line and the second source line is equipotential with the second bit line;
    erasing the first row of the array of memory cells;
    programming the first memory cell and inhibiting the second memory cell, wherein the second column includes a third memory cell in a second row of the array and the first column includes a fourth memory cell in the second row of the array of memory cells, wherein the third memory cell is connected between the second bit line and the second source line and the fourth memory cell is connected between the first bit line and the first source line; and
    applying a first reference voltage on a first write line shared by the first memory cell and the second memory cell, wherein programming the first memory cell comprises applying a programming voltage on the first bit line, and inhibiting the second memory cell comprises applying an inhibit voltage on the second bit line.

5. The method of claim 4, further comprising:
    applying the programming voltage on a first select line shared by the first memory cell and the second memory cell;
    applying the programming voltage on a second write line shared by the third memory cell and the fourth memory cell; and
    applying the inhibit voltage on a second select line shared by the third memory cell and the fourth memory cell.

6. The method of claim 5, further comprising applying a second reference voltage on the first write line, wherein erasing the first row of the memory array comprises applying an erase voltage on the first bit line and the second bit line.

7. The method of claim 6, further comprising:
    applying the second reference voltage on the second write line;
    applying the inhibit voltage on the second select line; and
    applying a hold-off voltage on the first select line.

8. The method of claim 5, wherein each of the first, second, third and fourth memory cells includes a non-volatile stored-charge memory transistor and a field effect pass transistor, having a common body connected to one of the programming voltage and the erase voltage, the memory transistor having a drain connected to a respective bit line, a control gate connected to a respective write line and a source connected to a drain of the pass transistor, the pass transistor having a control gate connected to a respective select line and a source connected to a respective source line.

9. The method of claim 8, wherein the memory transistor comprises one of a floating gate transistor and a trapped-charge SONOS-type transistor.

10. An apparatus, comprising:
    a memory array comprising memory cells arranged in rows and columns; and
    a memory controller coupled to the memory array, comprising:
        a row controller configured to select a first row of the memory array for a write operation and to deselect a second row of the memory array, wherein the first row comprises a first memory cell coupled between a first bit line and a first source line in a first column of the memory array and a second memory cell coupled between a second bit line and a second source line in a second column of the memory array, wherein each of the memory cells includes a memory transistor and a pass transistor; and a column controller configured to connect the first bit line to the first source line and to connect the second bit line to the second source line, the column controller further configured to erase the first row of the memory array.

11. The apparatus of claim 10, wherein the memory controller is further configured to program the first memory cell and to inhibit the second memory cell from programming.

12. The apparatus of claim 11, wherein the second row comprises a third memory cell coupled between the second bit line and the second source line and a fourth memory cell coupled between the first bit line and the first source line.

13. An apparatus, comprising:
a memory array comprising memory cells arranged in rows and columns; and
a memory controller coupled to the memory array, comprising:
a row controller configured to select a first row of the memory array for a write operation and to deselect a second row of the memory array, wherein the first row comprises a first memory cell coupled between a first bit line and a first source line in a first column of the memory array and a second memory cell coupled between a second bit line and a second source line in a second column of the memory array; and
a column controller configured to connect the first bit line to the first source line and to connect the second bit line to the second source line, the column controller further configured to erase the first row of the memory array, wherein the memory controller is further configured to program the first memory cell and to inhibit the second memory cell from programming, wherein the second row comprises a third memory cell coupled between the second bit line and the second source line and a fourth memory cell coupled between the first bit line and the first source line, wherein the row controller is configured to apply a first reference voltage on a first write line shared by the first memory cell and the second memory cell, wherein to program the first memory cell the column controller is configured to apply a programming voltage on the first bit line, and wherein to inhibit the second memory cell the column controller is configured to apply an inhibit voltage on the second bit line.

14. The apparatus of claim 13, wherein the row controller is configured to:
apply the programming voltage on a first select line shared by the first memory cell and the second memory cell and on a second write line shared by the third memory cell and the fourth memory cell; and to
apply the inhibit voltage on a second select line shared by the third memory cell and the fourth memory cell.

15. The apparatus of claim 14, wherein the row controller is further configured to apply a second reference voltage on the first write line, wherein to erase the first row of the memory array, the column controller is configured to apply an erase voltage on the first bit line and the second bit line.

16. The apparatus of claim 15, wherein the row controller is further configured to:
apply the second reference voltage on the second write line; to
apply the inhibit voltage on the second select line; and to
apply a hold-off voltage on the first select line.

17. The apparatus of claim 14, wherein each of the first, second, third and fourth memory cells includes a non-volatile stored-charge memory transistor and a field effect pass transistor, having a common body connected to one of the programming voltage and the erase voltage, the memory transistor having a drain connected to a respective bit line, a control gate connected to a respective write line and a source connected to a drain of the pass transistor, the pass transistor having a control gate connected to a respective select line and a source connected to a respective source line.

18. The apparatus of claim 17, wherein the memory transistor comprises one of a floating gate transistor and a trapped-charge SONOS-type transistor.

19. An apparatus, comprising:
means for selecting a row of memory cells in a memory array for a write operation, wherein each of the memory cells includes a memory transistor and a pass transistor;
means for selectively connecting source lines of the memory cells to bit lines of the memory cells to conform the voltages on the source lines to voltages on the bit lines; and
means for selectively programming and erasing memory cells in the row of memory cells.

20. The apparatus of claim 19, wherein the means for selectively tracking the source line voltages to the bit line voltages comprises means for selectively connecting and disconnecting the source lines to the bit lines.

\* \* \* \* \*